United States Patent
Peng et al.

(10) Patent No.: US 12,402,444 B2
(45) Date of Patent: Aug. 26, 2025

(54) MICRO LIGHT EMITTING DIODE STRUCTURE AND MICRO LIGHT EMITTING DIODE DISPLAY DEVICE

(71) Applicant: PlayNitride Display Co., Ltd., MiaoLi County (TW)

(72) Inventors: You-Lin Peng, MiaoLi County (TW); Wan-Jung Peng, MiaoLi County (TW); Fei-Hong Chen, MiaoLi County (TW); Pai-Yang Tsai, MiaoLi County (TW); Tzu-Yang Lin, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 449 days.

(21) Appl. No.: 17/988,784

(22) Filed: Nov. 17, 2022

(65) Prior Publication Data

US 2023/0343898 A1  Oct. 26, 2023

Related U.S. Application Data

(63) Continuation-in-part of application No. 17/748,049, filed on May 19, 2022.

(30) Foreign Application Priority Data

Apr. 25, 2022  (TW) .................................. 111115561

(51) Int. Cl.
    *H01L 21/78*  (2006.01)
    *H01L 25/075*  (2006.01)
    (Continued)

(52) U.S. Cl.
    CPC ..... *H10H 20/8312* (2025.01); *H01L 25/0753* (2013.01); *H10H 20/857* (2025.01)

(58) Field of Classification Search
    CPC ....... H01L 33/382; H01L 33/62; H01L 33/38; H01L 25/167; H01L 33/40;
    (Continued)

(56) References Cited

U.S. PATENT DOCUMENTS

| | | | |
|---|---|---|---|
| 7,285,858 B2 * | 10/2007 | Tsuchiya | H01L 23/293 257/E21.511 |
| 8,410,505 B2 * | 4/2013 | Chu | H01L 33/405 257/98 |
| 9,006,766 B2 * | 4/2015 | Kojima | H01L 33/62 257/98 |

(Continued)

FOREIGN PATENT DOCUMENTS

| | | |
|---|---|---|
| CN | 104241493 | 12/2014 |
| CN | 111463233 | 7/2020 |

(Continued)

OTHER PUBLICATIONS

"Office Action of Korea Counterpart Application", issued on Jun. 2, 2024, pp. 1-5.

(Continued)

*Primary Examiner* — Vu A Vu
(74) *Attorney, Agent, or Firm* — JCIPRNET

(57) ABSTRACT

A micro light emitting diode structure including an epitaxial structure, an electrode layer, a barrier layer and a bonding layer is provided. The epitaxial structure has a surface. The electrode layer is disposed on the surface of the epitaxial structure. The barrier layer is disposed on the electrode layer. The bonding layer is disposed on the barrier layer and away from the electrode layer.

14 Claims, 17 Drawing Sheets

(51) Int. Cl.
*H10H 20/831* (2025.01)
*H10H 20/857* (2025.01)

(58) Field of Classification Search
CPC . H01L 25/0753; H01L 27/124; H01L 27/156; H01L 33/20; H01L 33/44
USPC .................................................. 257/211, 79
See application file for complete search history.

(56) References Cited

U.S. PATENT DOCUMENTS

| | | | |
|---|---|---|---|
| 10,957,735 B2 * | 3/2021 | Liao | H01L 33/06 |
| 2020/0066954 A1 * | 2/2020 | Kuo | H01L 33/42 |
| 2021/0066549 A1 * | 3/2021 | Liu | H01L 33/14 |
| 2023/0335697 A1 * | 10/2023 | Hashimoto | G09F 9/00 |
| 2024/0266470 A1 * | 8/2024 | Xiong | H01L 23/488 |

FOREIGN PATENT DOCUMENTS

| | | |
|---|---|---|
| CN | 112530819 | 3/2021 |
| CN | 113284997 | 8/2021 |
| CN | 113410347 | 9/2021 |
| CN | 114300401 | 4/2022 |
| KR | 20150000108 | 1/2015 |
| TW | 201210074 | 3/2012 |
| TW | 202010152 | 3/2020 |

OTHER PUBLICATIONS

"Office Action of Taiwan Counterpart Application", issued on Dec. 23, 2022, p. 1-p. 8.
"Office Action of China Counterpart Application", issued on Mar. 27, 2025, p. 1-p. 8.

* cited by examiner

MICRO LIGHT EMITTING DIODE STRUCTURE AND MICRO LIGHT EMITTING DIODE DISPLAY DEVICE

CROSS-REFERENCE TO RELATED APPLICATION

This application is a continuation-in-part application of and claims the priority benefit of U.S. application Ser. No. 17/748,049, filed on May 19, 2022, now pending, which claims the priority benefit of Taiwan application serial no. 111115561, filed on Apr. 25, 2022. The entirety of each of the above-mentioned patent applications is hereby incorporated by reference herein and made a part of this specification.

BACKGROUND

Technical Field

The invention relates to a light emitting structure and a light emitting device, and particularly relates to a micro light emitting diode structure and a micro light emitting diode display device.

Description of Related Art

In an existing solder bump process, an orthogonal projection area of a barrier layer on an epitaxial structure is equal to an orthogonal projection area of an electrode layer on the epitaxial structure, so that when subsequent transfer and bonding with a display back plate is implemented to perform a reflow process, a high temperature may easily lead to formation of a metal eutectic between the solder bump and the electrode layer, thereby affecting electrical properties and structural reliability of a micro light emitting diode display device.

SUMMARY

The invention is directed to a micro light emitting diode structure, which has better electrical properties and structural reliability.

The invention is directed to a micro light emitting diode display device including the aforementioned micro light emitting diode structure, and has a better display yield.

The invention provides a micro light emitting diode structure including an epitaxial structure, an electrode layer, a barrier layer and a bonding layer is provided. The epitaxial structure has a surface. The electrode layer is disposed on the surface of the epitaxial structure. The barrier layer is disposed on the electrode layer. The bonding layer is disposed on the barrier layer and away from the electrode layer.

The invention provides a micro light emitting diode display device including a display substrate and a plurality of micro light emitting diode structures. The micro light emitting diode structures are disposed on the display substrate and respectively include an epitaxial structure, an electrode layer, a barrier layer and a bonding layer. The epitaxial structure has a surface. The electrode layer is disposed on the surface of the epitaxial structure and exposes an electrode surface. The barrier layer is disposed on the electrode layer and completely covers the electrode surface. The bonding layer is disposed on the barrier layer. The bonding layer is bonded to the corresponding pads, so that the micro light-emitting diode structures are electrically connected to the display substrate.

Based on the above description, in the design of the micro light emitting diode structure of the invention, the barrier layer is disposed on the electrode layer, and the bonding layer is disposed on the barrier layer and away from the electrode layer. Namely, in the invention, the barrier layer is used to prevent the eutectic problem between the electrode layer and the bonding layer, and can make the bonding layer disposed on the barrier layer have better adhesion. Therefore, the micro light emitting diode structure of the invention may have better electrical properties and structural reliability, and the micro light emitting diode display device using the micro light emitting diode structures of the invention may have better display yield.

To make the aforementioned more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
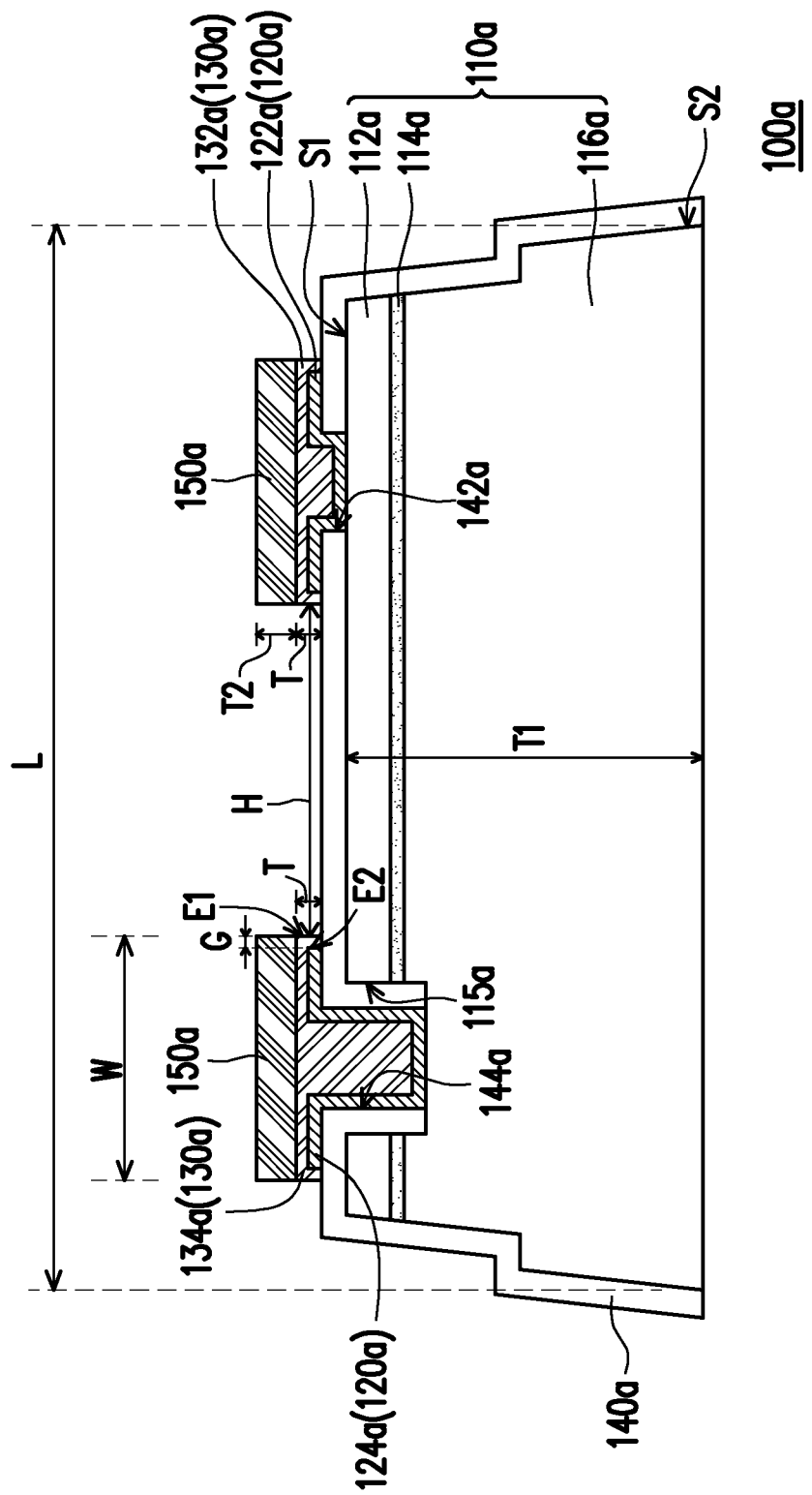
FIG. 1A is a schematic cross-sectional view of a micro light emitting diode structure according to an embodiment of the invention.
Figure 1B:
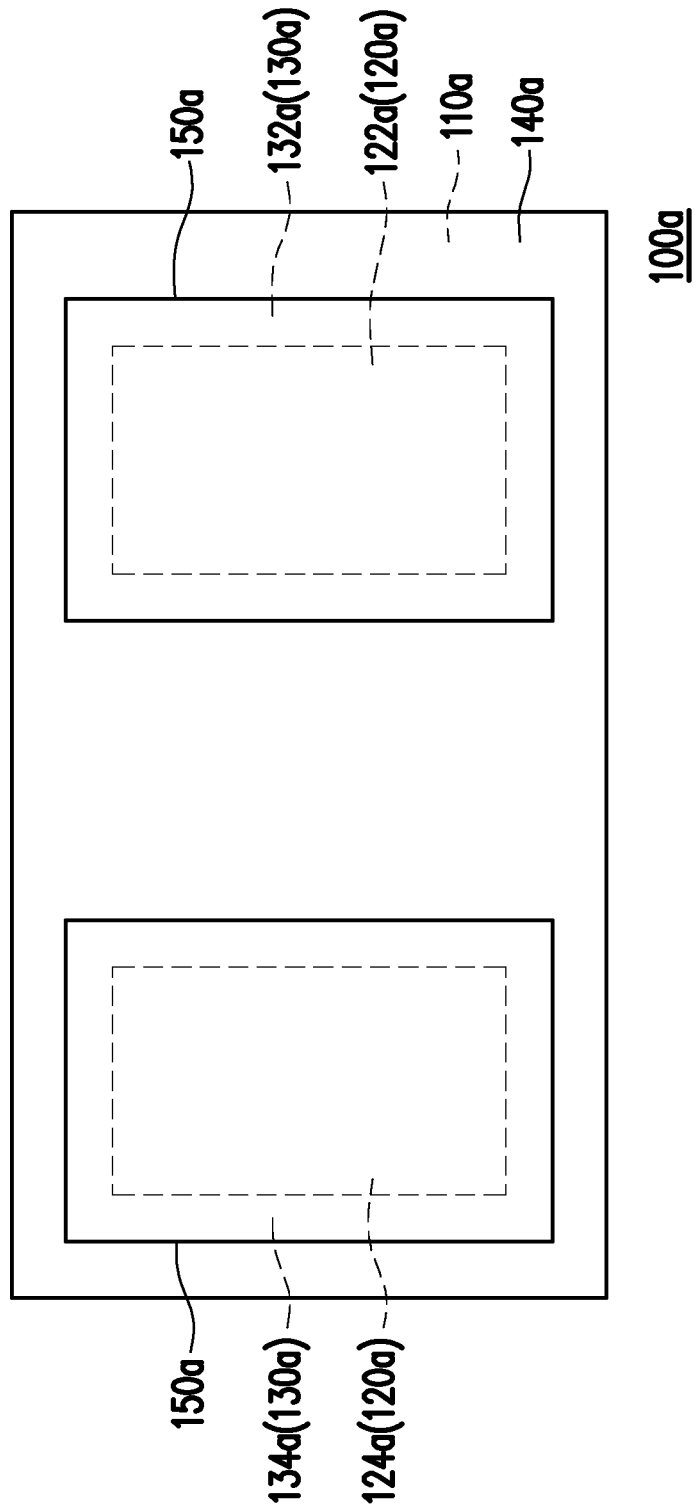
FIG. 1B is a schematic top view of the micro light emitting diode structure of FIG. 1A.

FIG. 1A is a schematic cross-sectional view of a micro light emitting diode structure according to an embodiment of the invention. FIG. 1B is a schematic top view of the micro light emitting diode structure of FIG. 1A. Referring to FIG. 1A first, in the embodiment, the micro light emitting diode structure 100a includes an epitaxial structure 110a, an electrode layer 120a and a barrier layer 130a. The epitaxial structure 110a has a surface S1. The electrode layer 120a is disposed on the surface S1 of the epitaxial structure 110a. The barrier layer 130a is disposed on the electrode layer 120a. An orthogonal projection area of the barrier layer 130a on the epitaxial structure 110a is greater than and covers an orthogonal projection area of the electrode layer 120a on the epitaxial structure 110a. Namely, the barrier layer 130a may contact the electrode layer 120a avoid a eutectic phenomenon generated during a subsequent reflow process, which ensures that the micro light emitting diode structure 100a of the embodiment has better electrical properties and structural reliability.

In detail, in the embodiment, the epitaxial structure 110a includes a first-type semiconductor layer 112a, a light emitting layer 114a, a second-type semiconductor layer 116a, and a through hole 115a. The light emitting layer 114a is located between the first-type semiconductor layer 112a and the second-type semiconductor layer 116a. The through hole 115a penetrates through the first-type semiconductor layer 112a, the light emitting layer 114a and a part of the second-type semiconductor layer 116a. One of the first-type semiconductor layer 112a and the second-type semiconductor layer 116a is a P-type semiconductor layer, and the other one of the first-type semiconductor layer 112a and the second-type semiconductor layer 116a is an N-type semiconductor layer. In addition, the micro light emitting diode structure 100a of the embodiment further includes an insulating layer 140a disposed on the epitaxial structure 110a and covering the surface S1 and a peripheral surface S2 of the epitaxial structure 110a. The insulating layer 140a has a first opening 142a exposing the first-type semiconductor layer 112a and a second opening 144a exposing the second-type semiconductor layer 116a, where the insulating layer 140a extends to cover an inner wall of the through hole 115a. Here, a cross-sectional profile of the epitaxial structure 110a is, for example, a trapezoidal profile, where a side surface of the first type semiconductor layer 112a, a side surface of the light emitting layer 114a and a side surface of the second type semiconductor layer 116a in the epitaxial structure 110a may be connected and extended obliquely in two stages, and the insulating layer 140a is disposed on the epitaxial structure 110a along the profile of the epitaxial structure 110a to achieve better yield.

Moreover, the electrode layer 120a in the embodiment includes a first electrode 122a and a second electrode 124a. The first electrode 122a is disposed on the insulating layer 140a and extends into the first opening 142a and is electrically connected to the first-type semiconductor layer 112a. The second electrode 124a is disposed on the insulating layer 140a and extends into the second opening 144a and is electrically connected to the second-type semiconductor layer 116a. The electrode layer 120a is, for example, a multi-layer film structure, where a material of the electrode layer 120a is, for example, copper, aluminum, platinum, titanium, gold, silver, chromium, or a combination thereof, but the invention is not limited thereto. Here, the first electrode 122a and the second electrode 124a are both located on the same side of the epitaxial structure 110a, which means that the micro light emitting diode structure 100a of the embodiment is embodied as a flip-chip micro light emitting diode structure.

In addition, the barrier layer 130a of the embodiment includes a first barrier portion 132a and a second barrier portion 134a. The first barrier portion 132a covers the first electrode 122a and contacts the insulating layer 140a and the first electrode 122a. The second barrier portion 134a covers the second electrode 124a and contacts the insulating layer 140a and the second electrode 124a. Here, the first barrier portion 132a and the second barrier portion 134a have flat surfaces on the side away from the first electrode 122a and the second electrode 124a.

Preferably, in the embodiment, the orthogonal projection area of the electrode layer 120a on the epitaxial structure 110a and the orthogonal projection area of the barrier layer 130a on the epitaxial structure 110a are preferably less than or equal to 0.95 and greater than or equal to 0.5, which may ensure that the barrier layer 130a completely covers the electrode layer 120a to provide sufficient protection during a subsequent bonding process. In addition, a ratio of a thickness T of the barrier layer 130a to a thickness T1 of the epitaxial structure 110a in this embodiment is preferably less than or equal to 0.1. If the ratio is above 0.1, it will affect subsequent electrical contact properties. Referring to FIG. 1A again, there is a gap G between a first edge E1 of the barrier layer 130a and a second edge E2 of the corresponding electrode layer 120a (for example, a gap between the second barrier portion 134a and the second electrode 124a), and a ratio of the gap G to a width W of the barrier layer 130a is greater than or equal to 0.05 and less than or equal to 0.5, where the gap G is, for example, greater than or equal to 0.3 μm and less than or equal to 10 μm, which may ensure that the barrier layer 130a completely covers the electrode layer 120a to provide sufficient protection. In addition, there is a horizontal distance H between the first barrier portion 132a and the second barrier portion 134a, and a ratio of the horizontal distance H to a width L of the epitaxial structure 110a in the same direction is greater than or equal to 0.01 and less than or equal to 0.3, where the horizontal distance H, for example, is between 0.3 μm and 15 μm, which may avoid a phenomenon of short circuit during the subsequent bonding process.

In addition, referring to FIG. 1A and FIG. 1B again, in the embodiment, the micro light emitting diode structure 100a further includes a bonding layer 150a disposed on the barrier layer 130a. Here, an orthogonal projection area of the bonding layer 150a on the epitaxial structure 110a is, for example, equal to the orthogonal projection area of the barrier layer 130a on the epitaxial structure 110a. Namely, the bonding layer 150a and the barrier layer 130a may be operated with a same photolithography process, which may effectively reduce the production cost. Moreover, in the embodiment, a ratio of the thickness T of the barrier layer 130a to a thickness T2 of the bonding layer 150a is less than or equal to 0.2, preferably, 0.03 to 0.2. In addition, a melting point of the barrier layer 130a is greater than a melting point of the bonding layer 150a, so as to effectively block the bonding layer 150a and the electrode layer 120a. A material of the bonding layer 150a is, for example, tin or tin alloy, and a material of the barrier layer 130a is, for example, nickel, platinum, titanium-tungsten or tungsten, but the invention is not limited thereto.

Figure 1C:
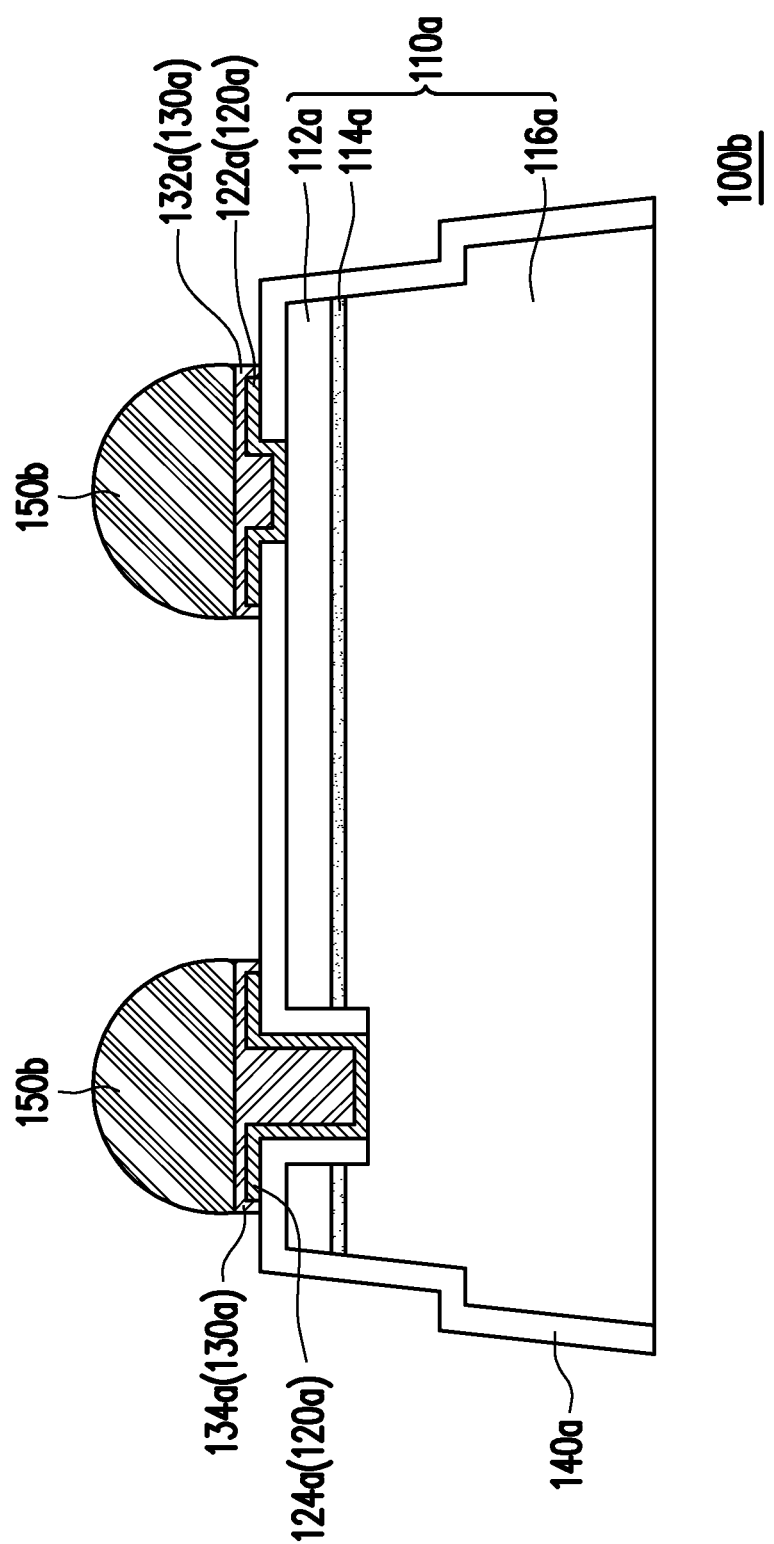
FIG. 1C is a schematic cross-sectional view of a micro light emitting diode structure according to another embodiment of the invention.

In brief, in the embodiment, the orthogonal projection area of the barrier layer 130a on the epitaxial structure 110a is larger than and covers the orthogonal projection area of the electrode layer 120a on the epitaxial structure 110a. Namely, in the embodiment, the barrier layer 130a is used to contact the electrode layer 120a, thereby effectively blocking the bonding layer 150a and the electrode layer 120a, so as to avoid a problem that the bonding layer 150a and the electrode layer 120a form eutectic during a subsequent reflow process. Therefore, the micro light emitting diode structure 100a of the embodiment may have better electrical properties and structural reliability. It should be noted that, as shown in FIG. 1C, in the micro light emitting diode structure 100b, the bonding layer 150b may also be embodied as two solder balls.

It should be noted that reference numbers of the components and a part of contents of the aforementioned embodiment are also used in the following embodiment, where the same reference numbers denote the same or like components, and descriptions of the same technical contents are omitted. The aforementioned embodiment may be referred for descriptions of the omitted parts, and detailed descriptions thereof are not repeated in the following embodiment.

Figure 2:
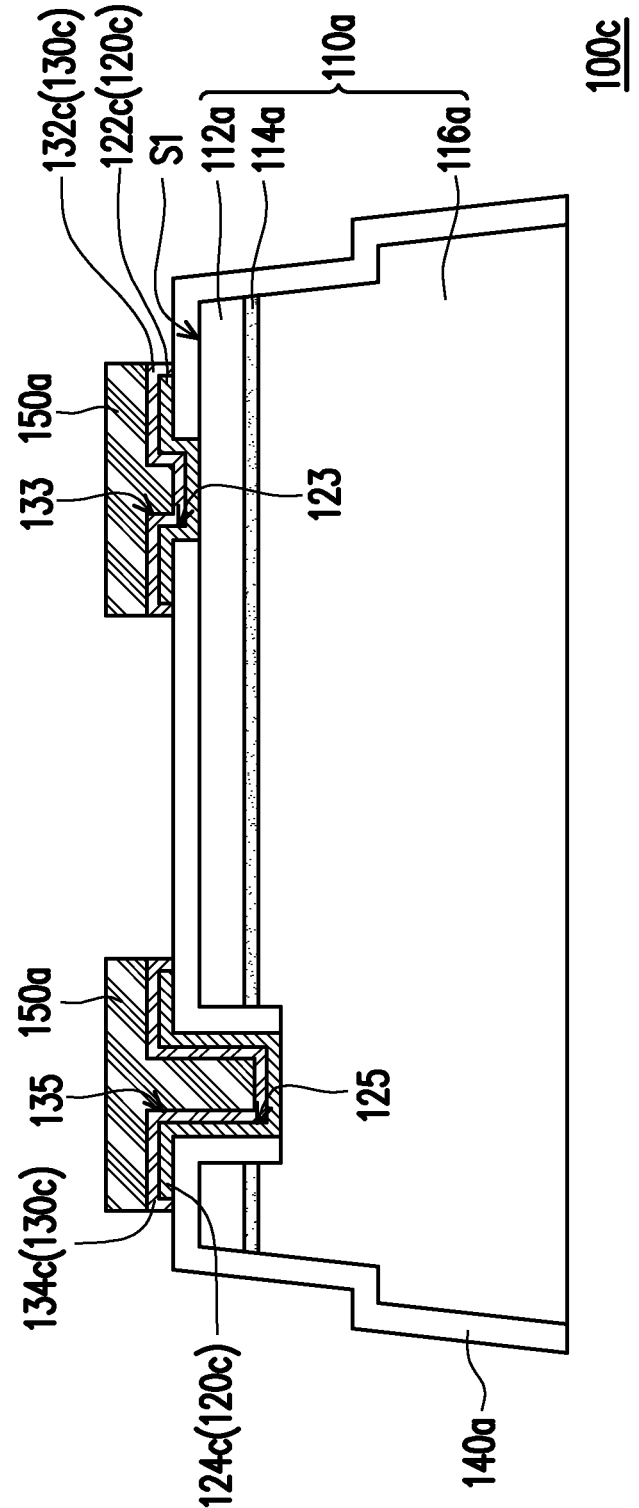
FIG. 2 is a schematic cross-sectional view of a micro light emitting diode structure according to another embodiment of the invention.

FIG. 2 is a schematic cross-sectional view of a micro light emitting diode structure according to another embodiment of the invention. Referring to FIG. 1A and FIG. 2 at the same time, a micro light emitting diode structure 100c of the embodiment is similar to the micro light emitting diode structure 100a of FIG. 1A, and a difference there between is that in the embodiment, a first electrode 122c of an electrode layer 120c has a first groove 123, and a second electrode 124c has a second groove 125. A first barrier portion 132c of a barrier layer 130c extends into the first groove 123 and is conformally disposed with the first electrode 122c. Namely, the first barrier portion 132c also has a groove 133. A second barrier portion 134c of the barrier layer 130c extends into the second groove 125 and is conformally disposed with the second electrode 124c. Namely, the second barrier portion 134c also has a groove 135. The bonding layer 150a is disposed on the first barrier portion 132c and the second barrier portion 134c, and fills the groove 133 of the first barrier portion 132c and the groove 135 of the second barrier portion 134c, so as to form an accommodating space through the groove 133 and the groove 135 during the subsequent bonding process, which may effectively avoid the contact between the electrode layer 120c and the barrier layer 130c.

Figure 3:
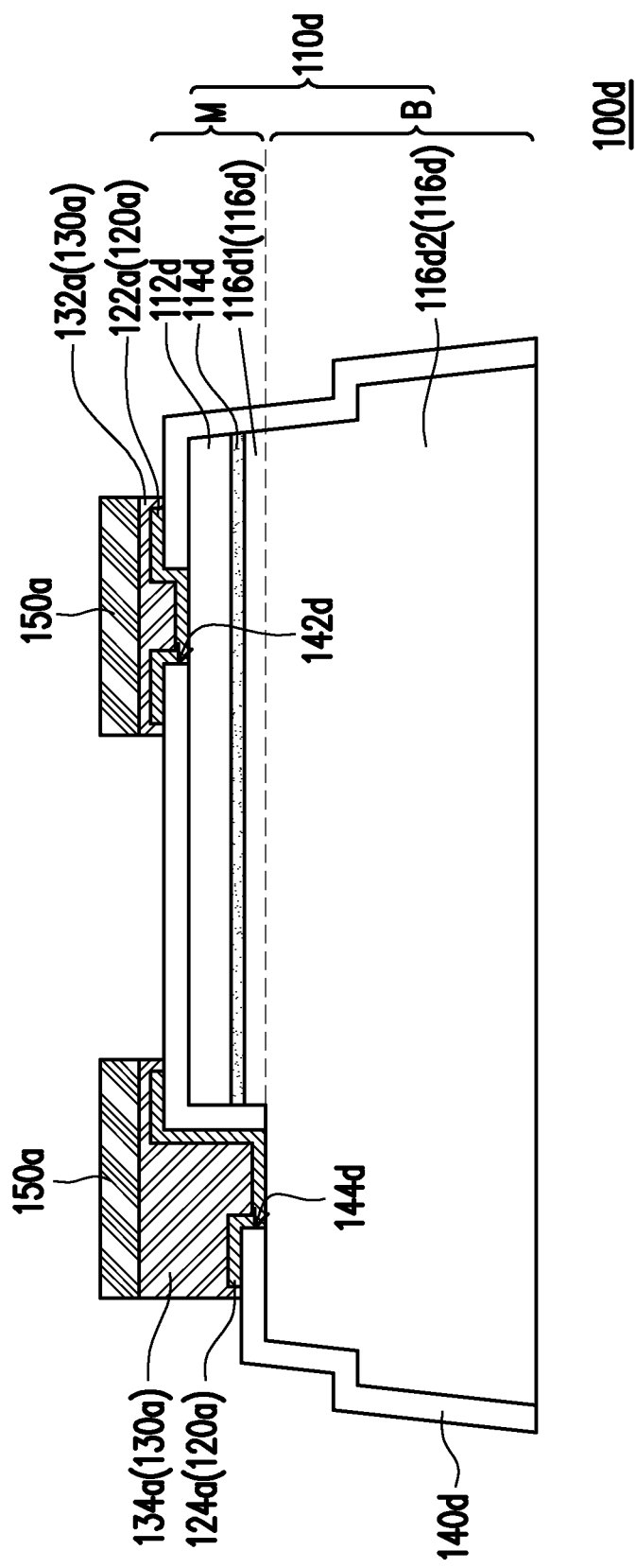
FIG. 3 is a schematic cross-sectional view of a micro light emitting diode structure according to another embodiment of the invention.

FIG. 3 is a schematic cross-sectional view of a micro light emitting diode structure according to another embodiment of the invention. Referring to FIG. 1A and FIG. 3 at the same time, a micro light emitting diode structure 100d of the embodiment is similar to the micro light emitting diode structure 100a of FIG. 1A, and a difference there between is that in the embodiment, a pattern of an epitaxial structure 110d is different from that of the epitaxial structure 110a. In detail, in the embodiment, a first-type semiconductor layer 112d, a light emitting layer 114d and a first portion 116d1 of a second-type semiconductor layer 116d form a mesa M. A second portion 116d2 of the second-type semiconductor layer 116d forms a base B with respect to the mesa M. A first opening 142d of an insulating layer 140d is located on the mesa M, and a second opening 144d exposes the second portion 116d2 of the second-type semiconductor layer 116d and is located on the base B. To be specific, the micro light emitting diode structure 100d is, for example, a horizontal micro light emitting diode structure.

Figure 4:
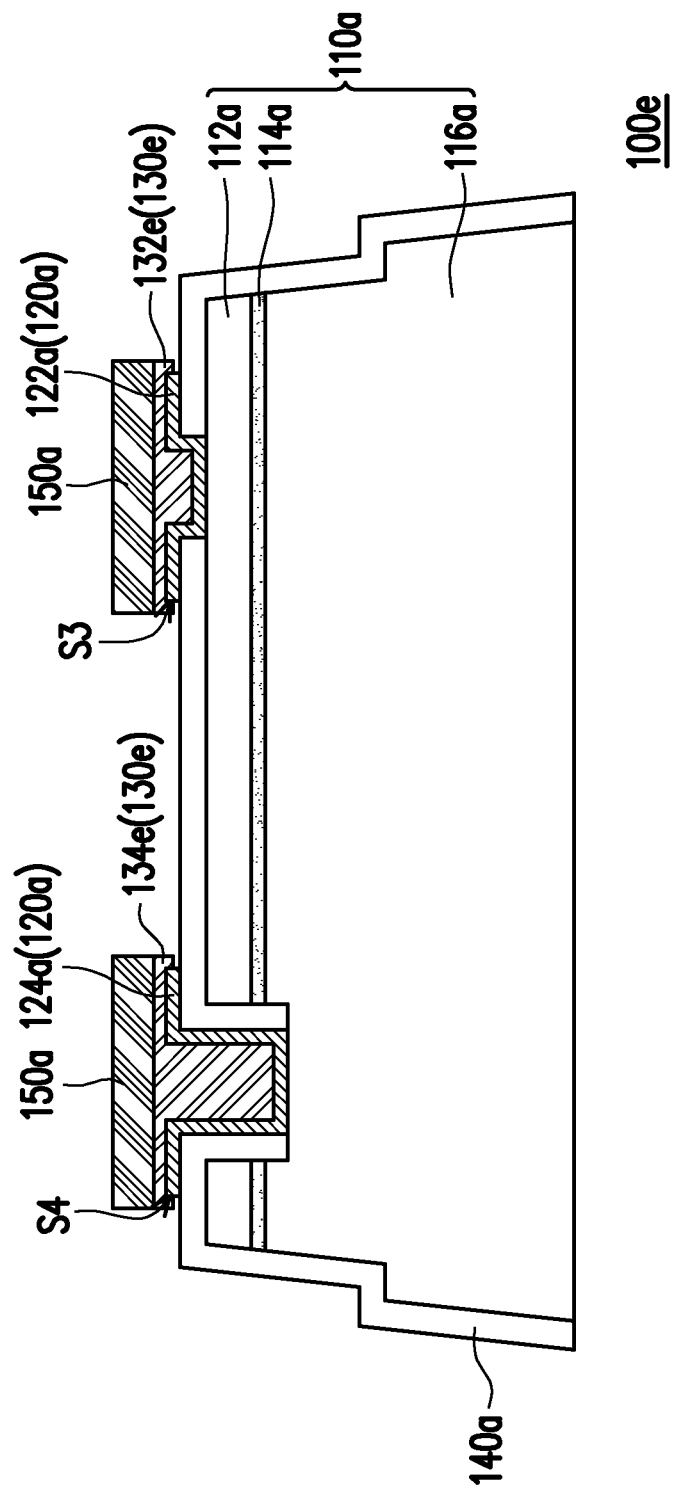
FIG. 4 is a schematic cross-sectional view of a micro light emitting diode structure according to another embodiment of the invention.

FIG. 4 is a schematic cross-sectional view of a micro light emitting diode structure according to another embodiment of the invention. FIG. 1A and FIG. 4 at the same time, a micro light emitting diode structure 100e of the embodiment is similar to the micro light emitting diode structure 100a of FIG. 1A, and a difference there between is that in the embodiment, a barrier layer 130e at least contacts a part of a peripheral surface of the electrode layer 120a. In detail, a first barrier portion 132e contacts a part of a peripheral surface S3 of the first electrode 122a, and a second barrier portion 134e contacts a part of a peripheral surface S4 of the second electrode 124a. Namely, the peripheral surface S3 of the first electrode 122a and the peripheral surface S4 of the second electrode 124a are not completely covered by the first barrier portion 132e and the second barrier portion 134e, so that there is more allowable space in the subsequent bonding process, and the barrier layer 130e may be deformed to cover the peripheral surface S3 of the first electrode 122a and the peripheral surface S4 of the second electrode 124a at the same time under high pressure and high temperature, so as to avoid short circuit caused by overflow bonding.

Figure 5:
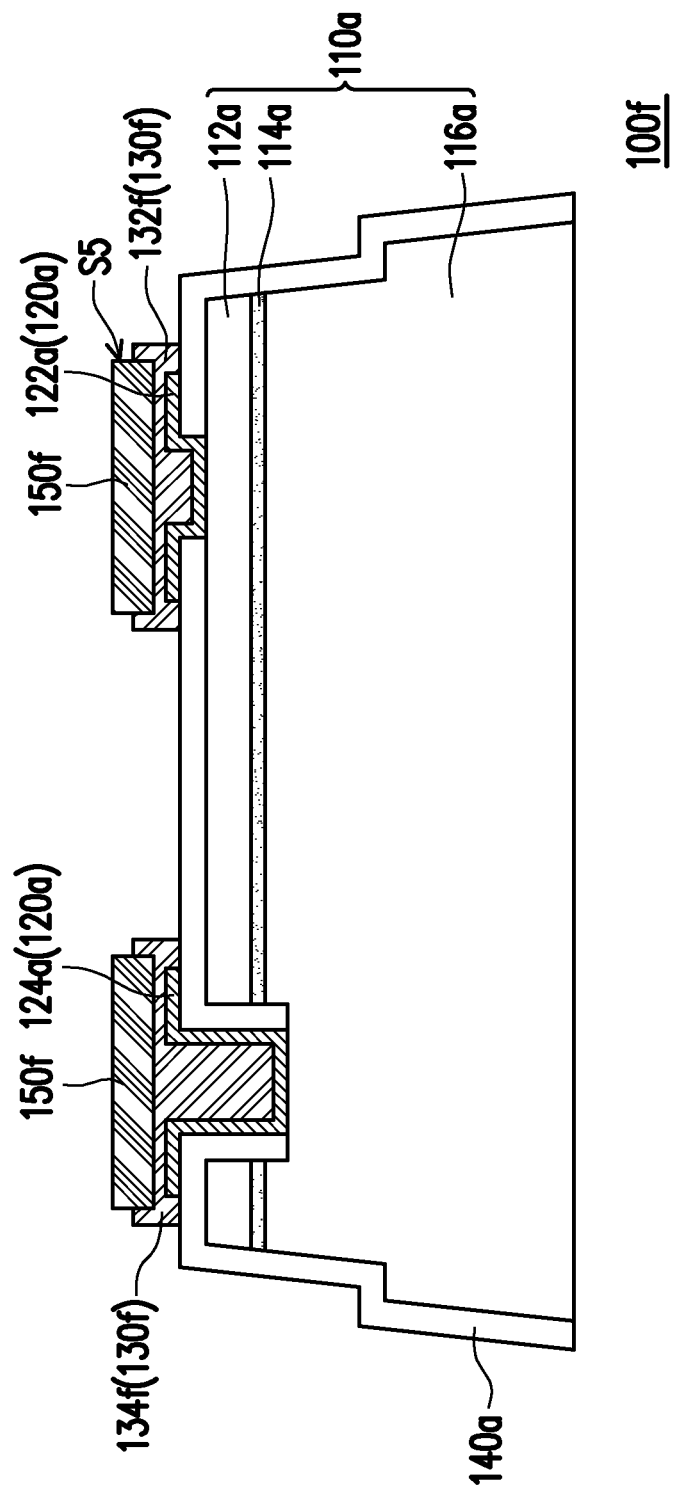
FIG. 5 is a schematic cross-sectional view of a micro light emitting diode structure according to another embodiment of the invention.

FIG. 5 is a schematic cross-sectional view of a micro light emitting diode structure according to another embodiment of the invention. Referring to FIG. 1A and FIG. 5 at the same time, a micro light emitting diode structure 100f of the embodiment is similar to the micro light emitting diode structure 100a of FIG. 1A, and a difference there between is that in the embodiment, a barrier layer 130f contacts a part of a peripheral surface S5 of a bonding layer 150f. In detail, a first barrier portion 132f and a second barrier portion 134f contact a part of the peripheral surface S5 of the corresponding bonding layer 150f, so as to prevent the bonding layer 150f from overflowing after the reflow process.

Figure 6:
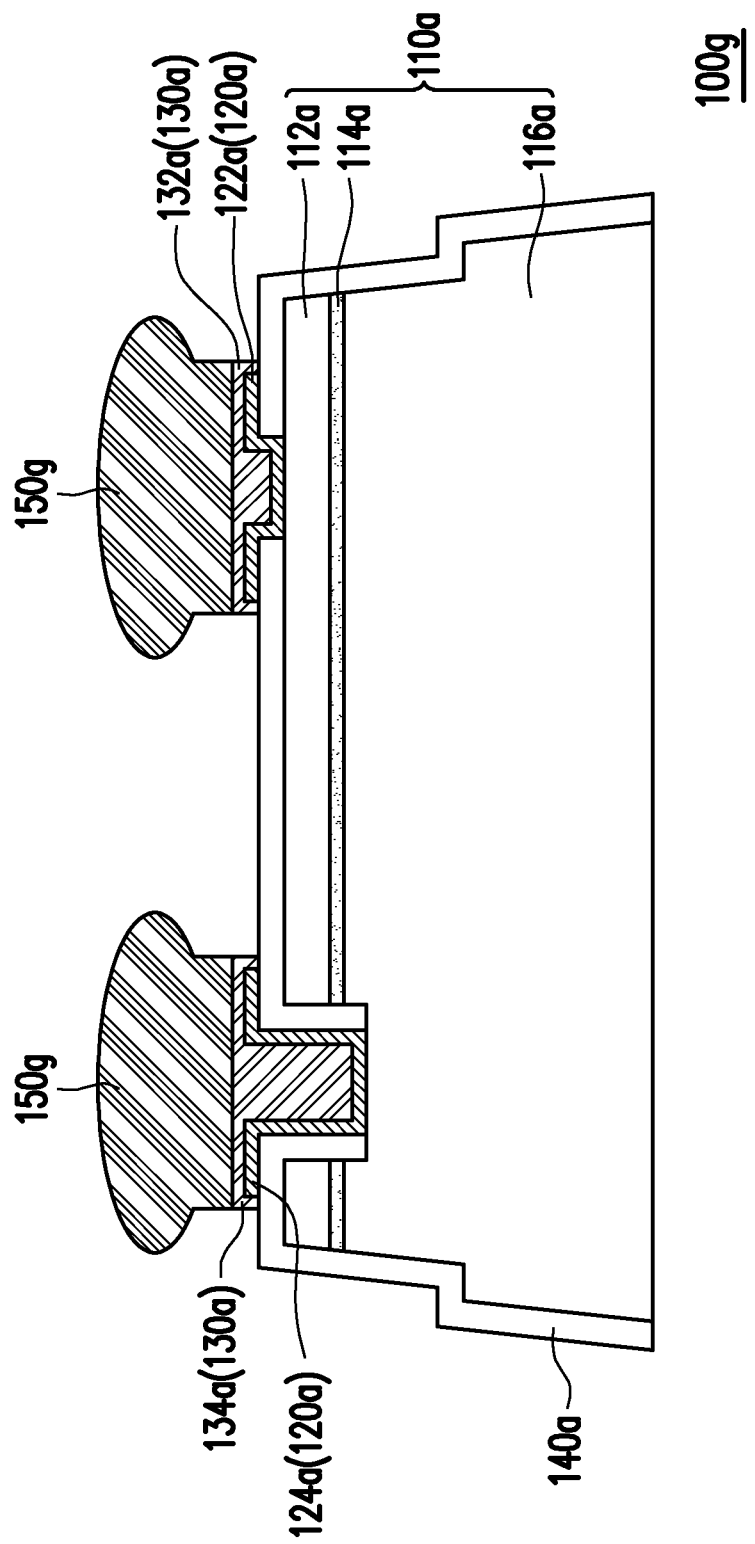
FIG. 6 is a schematic cross-sectional view of a micro light emitting diode structure according to another embodiment of the invention.

FIG. 6 is a schematic cross-sectional view of a micro light emitting diode structure according to another embodiment of the invention. Referring to FIG. 1A and FIG. 6 at the same time, a micro light emitting diode structure 100g of the embodiment is similar to the micro light emitting diode structure 100a of FIG. 1A, and a difference there between is that in the embodiment, an orthogonal projection area of a bonding layer 150g on the epitaxial structure 110a is larger than an orthogonal projection area of the barrier layer 130a on the epitaxial structure 110a. Namely, different processes may be adopted to fabricate the bonding layer 150g and the barrier layer 130a, which not only effectively blocks the bonding layer 150a and the electrode layer 120a, but also increases a bonding area when the bonding layer 150a is subsequently bonded to pads of a display back plate.

Figure 7:
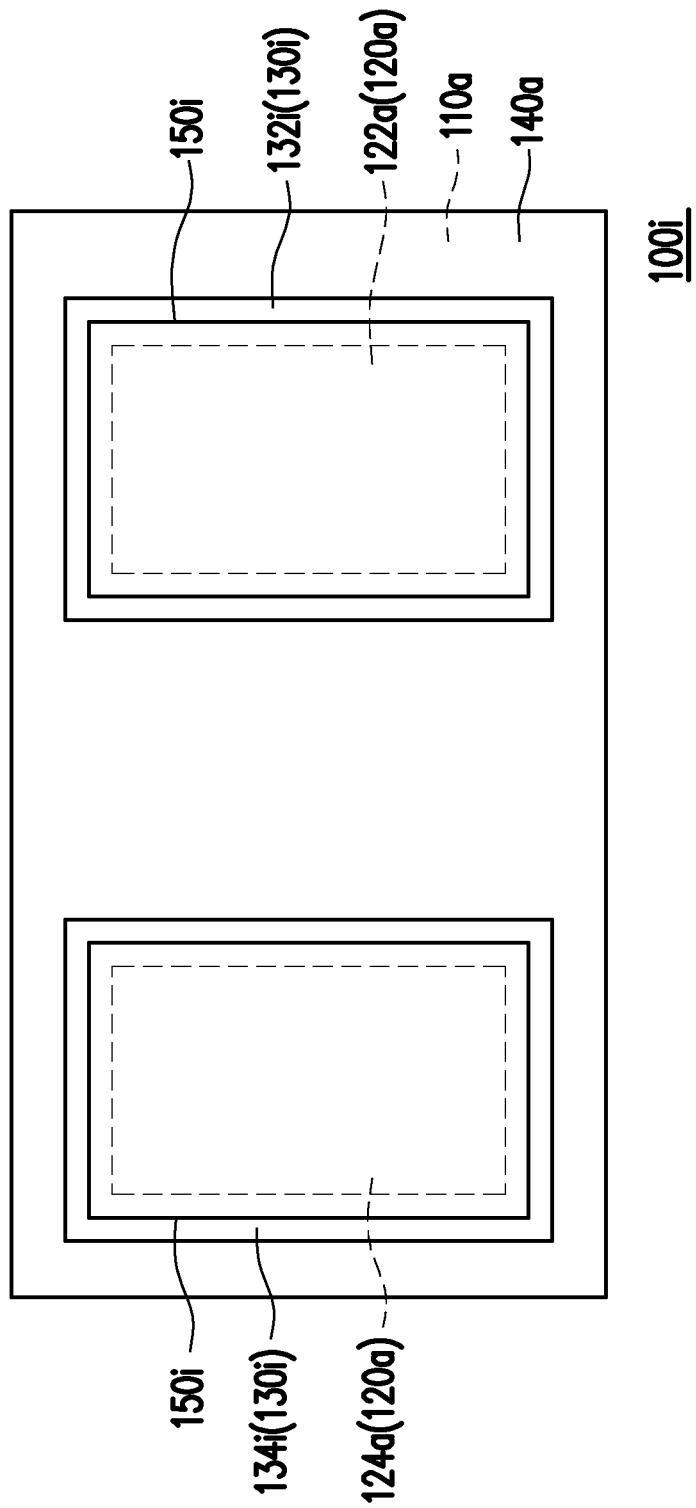
FIG. 7 is a schematic top view of a micro light emitting diode structure according to another embodiment of the invention.

FIG. 7 is a schematic top view of a micro light emitting diode structure according to another embodiment of the invention. Referring to FIG. 1B and FIG. 7 at the same time, a micro light emitting diode structure 100i of the embodiment is similar to the micro light emitting diode structure 100a of FIG. 1B, and a difference there between is that in the embodiment, an orthogonal projection area of a bonding layer 150i on the epitaxial structure 110a is smaller than an orthogonal projection area of a barrier layer 130i on the epitaxial structure 110a and larger than an orthogonal projection area of the electrode layer 120a on the epitaxial structure 110a. Namely, the orthogonal projection area of the bonding layer 150i on the epitaxial structure 110a is smaller than the orthogonal projection area of the corresponding first barrier portion 132i on the epitaxial structure 110a and larger than the orthogonal projection area of the first electrode 122a on the epitaxial structure 110a. The orthogonal projection area of the bonding layer 150i on the epitaxial structure 110a is smaller than the orthogonal projection area of the corresponding second barrier portion 134i on the epitaxial structure 110a and larger than the orthogonal projection area of the second electrode 124a on the epitaxial structure 110a. Preferably, a ratio of the orthogonal projection area of the bonding layer 150i on the epitaxial structure 110a to the orthogonal projection area of the barrier layer 130i on the epitaxial structure 110a is, for example, less than or equal to 0.9 and greater than or equal to 0.5, and if the above ratio is less than 0.5, a bonding strength of the subsequently bonded bonding layer 150i may be insufficient, and a ratio of the orthogonal projection area of the bonding layer 150i on the epitaxial structure 110a to the orthogonal projection area of the electrode layer 120a on the epitaxial structure 110a is, for example, greater than 1 and less than or equal to 1.5.

Figure 8:
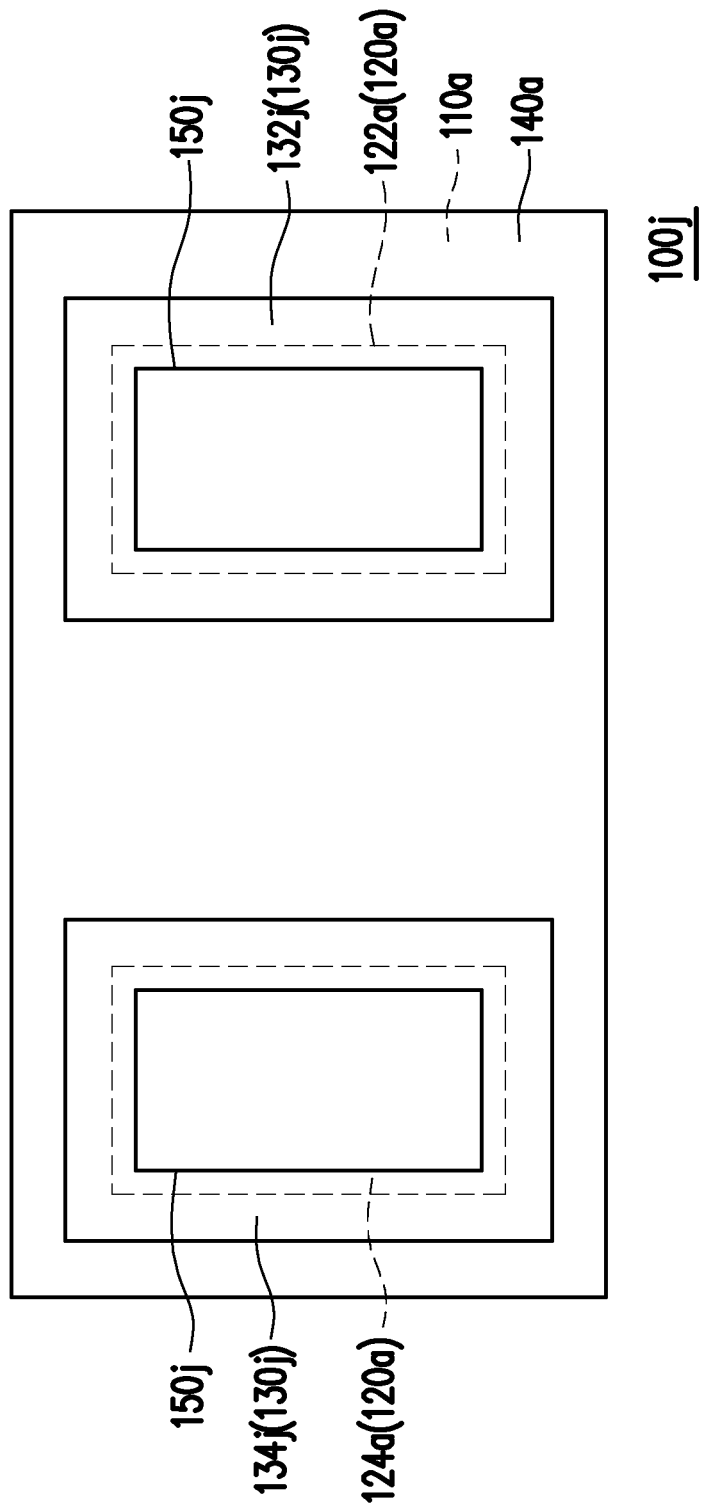
FIG. 8 is a schematic top view of a micro light emitting diode structure according to another embodiment of the invention.

Since the orthogonal projection area of the bonding layer 150i on the epitaxial structure 110a is smaller than the orthogonal projection area of the barrier layer 130i on the epitaxial structure 110a. i.e., the bonding layer 150i is retracted by a distance relative to the barrier layer 130i, a risk of overflow of the bonding layer 150i during the subsequent reflow process is effectively reduced. As shown in FIG. 8, an orthogonal projection area of a bonding layer 150j on the epitaxial structure 110a is smaller than an orthogonal projection area of a barrier layer 130j on the epitaxial structure 110a and an orthogonal projection area of the electrode layer 120a on the epitaxial structure 110a, when the applied micro light emitting diode structure 100j is smaller, for example, smaller than or equal to 15 μm, the bonding layer 150j and the electrode layer 120a may be effectively blocked.

Figure 9:
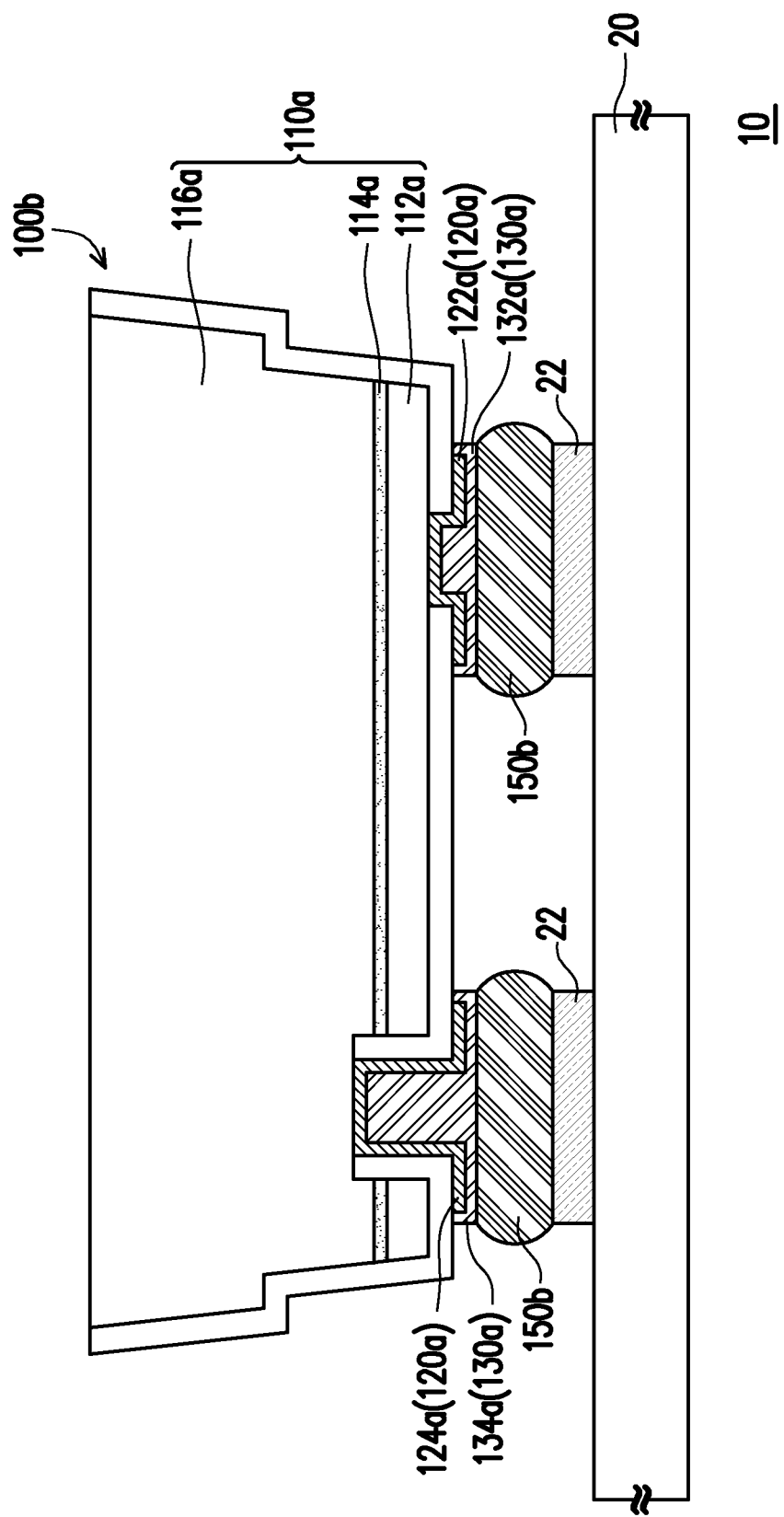
FIG. 9 is a schematic cross-sectional view of a micro light emitting diode display device according to an embodiment of the invention.

FIG. 9 is a schematic cross-sectional view of a micro light emitting diode display device according to an embodiment of the invention. Referring to FIG. 9, in the embodiment, the micro light emitting diode display device 10 includes a display substrate 20 and, for example, the micro light emitting diode structure 100b shown in FIG. 1C, where the micro light emitting diode structure 100b is disposed on the display substrate 20. In detail, in the embodiment, the display substrate 20 includes a plurality of pads 22, and the bonding layer 150b is bonded to the pads 22, so that the micro light emitting diode structure 100b is disposed on the display substrate 20 and is electrically connected to the display substrate 20. An orthogonal projection area of the barrier layer 130a on the display substrate 20 is larger than and covers an orthogonal projection area of the electrode layer 120a on the display substrate 20, which may effectively avoid a problem that the bonding layer 150b overflows to form a eutectic with the first electrode 122a and the second electrode 124a of the electrode layer 120a due to a high temperature and high pressure process of eutectic bonding when the micro light emitting diode structure 100b is bonded to the display substrate 20. Here, the orthogonal projection area of the barrier layer 130a on the display substrate 20 is larger than the orthogonal projection area of the electrode layer 120a on the display substrate 20 and less than or equal to an orthogonal projection area of the pad 22 on the display substrate 20. The orthogonal projection area of the bonding layer 150b on the display substrate 20 is greater than or equal to the orthogonal projection area of the barrier layer 130a on the display substrate 20, which may effectively protect the bonding layer 150b from overflowing when the micro light emitting diode structure 100b is bonded to the display substrate 20, and meanwhile achieves better bonding through a larger pad area and bonding layer area, when the applied micro light emitting diode structure 100b is larger, for example, larger than or equal to 15 μm. Therefore, the micro light emitting diode display device 10 of the embodiment may have a better display yield.

It should be noted that in other embodiments that are not shown, the micro light emitting diode display device may include at least any one of the micro light emitting diode structures 100a, 100b, 100c, 100d, 100e, 100f, 100g, 100i, 100j according to actual requirements, which is not limited by the invention. Namely, the number of the micro light emitting diode structures may be one or plural, and the micro light emitting diode structures may be the same structure or different structures, which may be selected according to actual requirements. In addition, the micro light emitting diode structure may be a red micro light emitting diode structure, a blue micro light emitting diode structure or a green micro light emitting diode structure. Moreover, the display substrate 20 of the embodiment may be, for example, a complementary metal-oxide-semiconductor (CMOS) substrate, a liquid crystal on silicon (LCOS) substrate, a thin film transistor (TFT) substrate or other substrates with working circuits, which are not limited by the invention.

Figure 10:
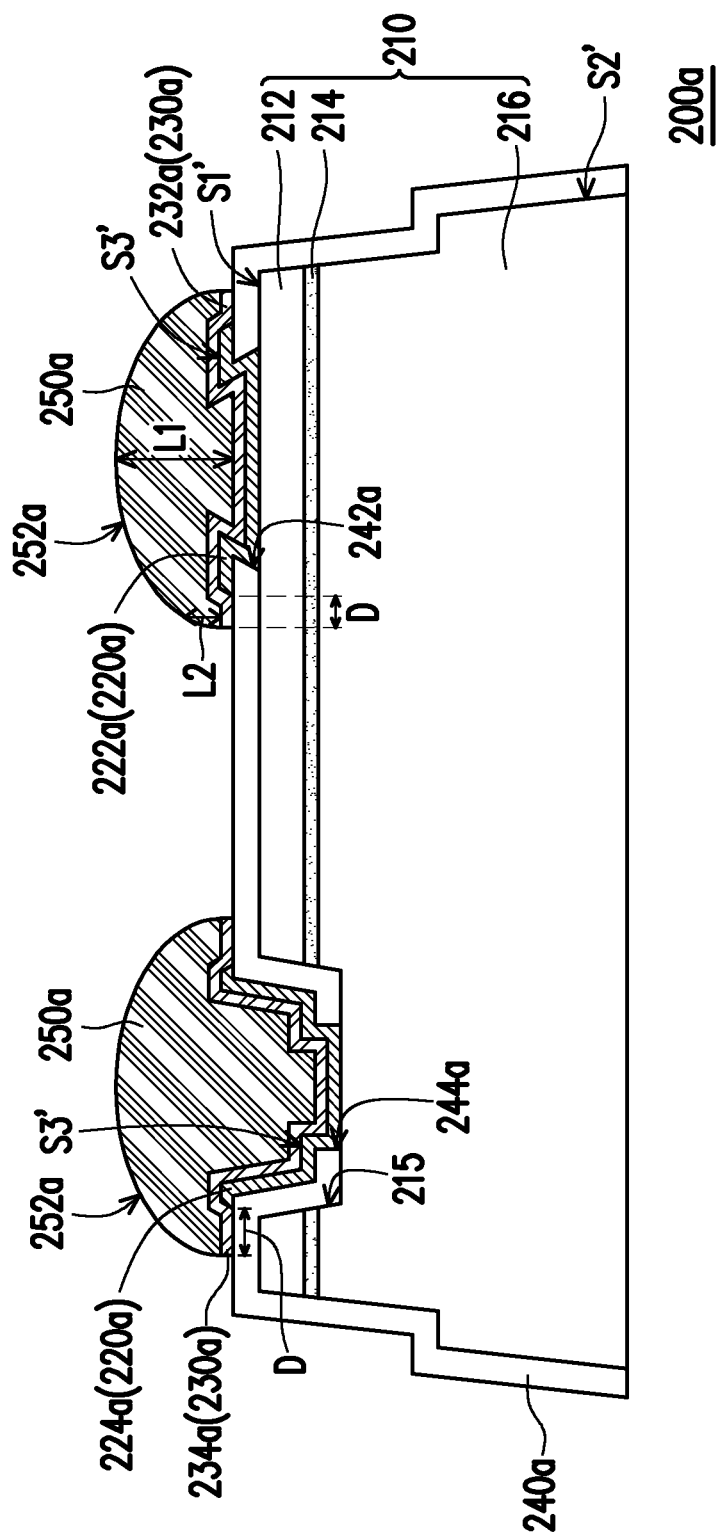
FIG. 10 is a schematic top view of a micro light emitting diode structure according to another embodiment of the invention.

FIG. 10 is a schematic top view of a micro light emitting diode structure according to another embodiment of the invention. Referring to FIG. 10, in the embodiment, the micro light emitting diode structure 200a includes an epitaxial structure 210, an electrode layer 220a, a barrier layer 230a and a bonding layer 250a. The epitaxial structure 210 has a surface S1'. The electrode layer 220a is disposed on the surface S1' of the epitaxial structure 210. The barrier layer 230a is disposed on the electrode layer 220a. The bonding layer 250a is disposed on the barrier layer 230a and away from the electrode layer 220a. Namely, the barrier layer 230a is used to prevent the eutectic problem between the electrode layer 220a and the bonding layer 250a, and can make the bonding layer 250a disposed on the barrier layer 230a have better adhesion. Therefore, the micro light emitting diode structure 200a of the embodiment may have better electrical properties and structural reliability.

In detail, in the embodiment, the epitaxial structure 210 includes a first-type semiconductor layer 212, a light emitting layer 214, a second-type semiconductor layer 216, and a through hole 215. The light emitting layer 214 is located between the first-type semiconductor layer 212 and the second-type semiconductor layer 216. The through hole 215 penetrates through the first-type semiconductor layer 212, the light emitting layer 214 and a part of the second-type semiconductor layer 216. One of the first-type semiconductor layer 212 and the second-type semiconductor layer 216 is a P-type semiconductor layer, and the other one of the first-type semiconductor layer 212 and the second-type semiconductor layer 216 is an N-type semiconductor layer. In addition, the micro light emitting diode structure 200a of the embodiment further includes an insulating layer 240a disposed on the epitaxial structure 210 and covering the surface S1' and a peripheral surface S2' of the epitaxial structure 210. The insulating layer 240a has a first opening 242a exposing the first-type semiconductor layer 212 and a second opening 244a exposing the second-type semiconductor layer 216, where the insulating layer 240a extends to cover an inner wall of the through hole 215. Here, a cross-sectional profile of the epitaxial structure 210 is, for example, a trapezoidal profile, where a side surface of the first type semiconductor layer 212, a side surface of the light emitting layer 214 and a side surface of the second type semiconductor layer 216 in the epitaxial structure 210 may be connected and extended obliquely in two stages, and the insulating layer 240a is disposed on the epitaxial structure 210 along the profile of the epitaxial structure 210 to achieve better yield. The insulating layer 240a can be, for example, a distributed bragg reflector.

Moreover, the electrode layer 220a is disposed on the epitaxial structure 210a and exposes a surface S3', and the barrier layer 230a completely covers the surface S3'. The electrode layer 220a in the embodiment includes a first electrode 222a and a second electrode 224a. One of first electrode 222a and the second electrode 224a is a P-type electrode, and the other one of the first electrode 222a and the second electrode 224a is an N-type electrode. The first electrode 222a is disposed in the first opening 242a of the insulating layer 240a and electrically connected with the first-type semiconductor layer 212. The second electrode 224a is disposed in the second opening 244a of the insulating layer 240a and electrically connected with the second-type semiconductor layer 216. Here, the first electrode 222a and the second electrode 224a are both located on the same side of the epitaxial structure 210, which means that the micro light emitting diode structure 200a of the embodiment is embodied as a flip-chip micro light emitting diode structure.

In addition, the barrier layer 230a of the embodiment includes a first barrier portion 232a and a second barrier portion 234a. The first barrier portion 232a covers the first electrode 222a and contacts the insulating layer 240a and the first electrode 222a. The second barrier portion 234a covers the second electrode 224a and contacts the insulating layer 240a and the second electrode 224a. Herein, ratios of orthographic projections of the first electrode 222a and the second electrode 224a on the epitaxial structure 210 to orthographic projections of the first barrier portion 232a and the second barrier portion 234a on the epitaxial structure 210 are respectively greater than or equal to 0.25 and less than or equal to 0.95. A material of the barrier layer 230a is, for example, nickel, platinum, titanium-tungsten or tungsten, but the invention is not limited thereto.

Referring to FIG. 10 again, in the embodiment, the bonding layer 250a has an upper surface 252a, and the upper surface 252a is a convex curved surface. A curvature of the upper surface 252a gradually decreases from a portion close to the barrier layer 250a to another portion away from the barrier layer 250a. Here, in cross-section, the outline of the bonding layer 250a is a semicircle, but the invention is not limited thereto. Preferably, the bonding layer 250a has a maximum thickness L1 at a center and an edge thickness L2 at an edge, and the maximum thickness L1 is greater than twice the edge thickness L2. Furthermore, an orthographic projection of the bonding layer 250a on the epitaxial structure 210 is equal to and covers an orthographic projection of the barrier layer 230a on the epitaxial structure 210, and a ration of the orthographic projection of the bonding layer 250a to the orthographic projection of the barrier layer 230a is equal to 1. There is a distance D between an edge of the bonding layer 250a and an edge of the electrode layer 220a, and a ration of an orthographic projection of the distance D on the epitaxial structure 210 to an orthographic projection of the electrode layer 220a on the epitaxial structure 210 is greater than or equal to 0.2. Here, the distance D is, for example, greater than 1 micrometer. A material of the bonding layer 250a is, for example, tin or tin alloy, but the invention is not limited thereto.

In brief, in the embodiment, the barrier layer 230a is disposed on the electrode layer 220a, and the bonding layer 250a is disposed on the barrier layer 230a and away from the electrode layer 220a. Namely, the barrier layer 230a is used to prevent the eutectic problem between the electrode layer 220a and the bonding layer 250a, and can make the bonding layer 250a disposed on the barrier layer 230a have better adhesion. Therefore, the micro light emitting diode structure 200a of the embodiment may have better electrical properties and structural reliability.

Figure 11:
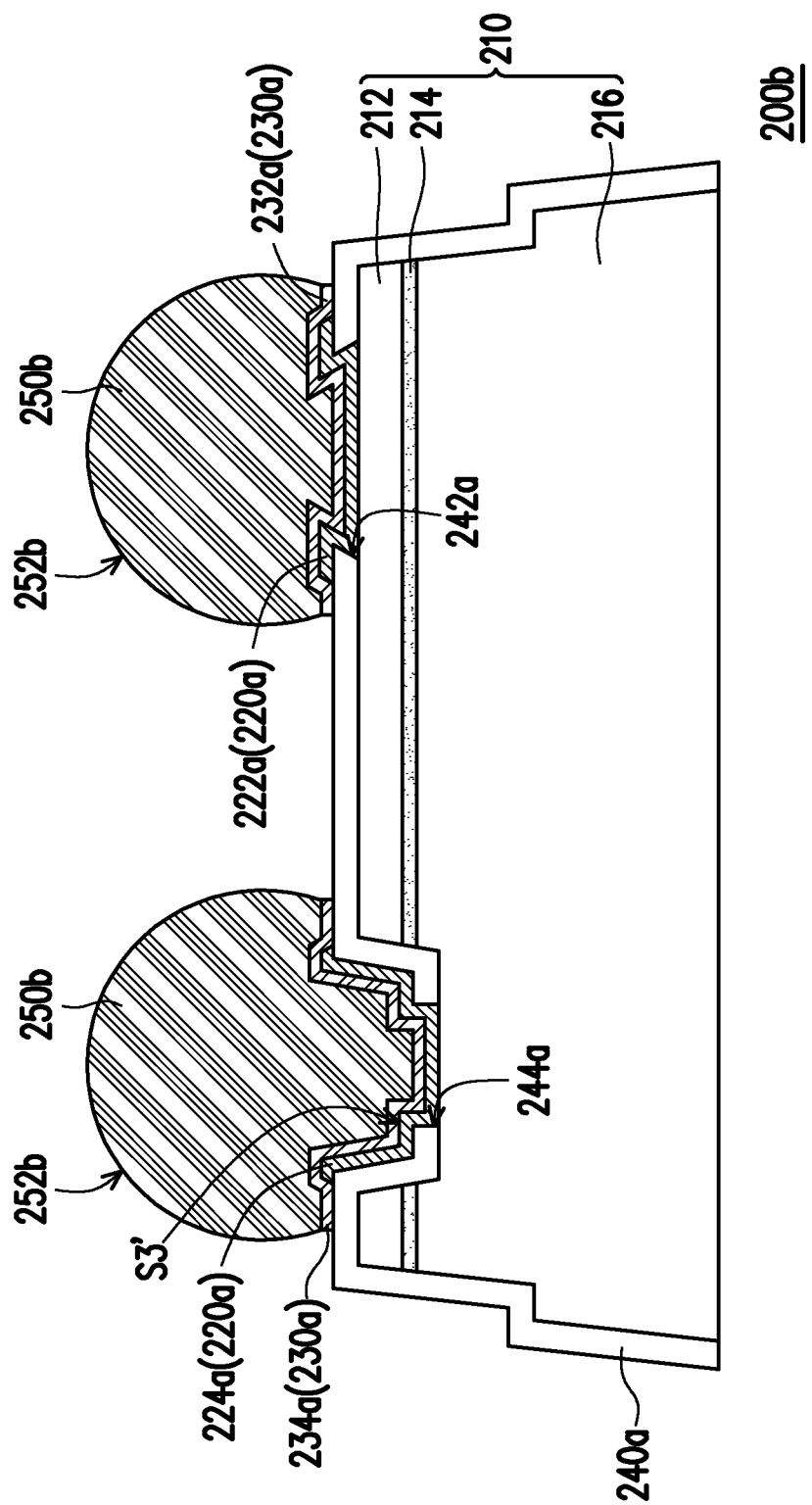
FIG. 11 is a schematic top view of a micro light emitting diode structure according to another embodiment of the invention.

FIG. 11 is a schematic top view of a micro light emitting diode structure according to another embodiment of the invention. Referring to FIG. 10 and FIG. 11 at the same time, a micro light emitting diode structure 200b of the embodiment is similar to the micro light emitting diode structure 200a of FIG. 10, and a difference there between is that in the embodiment, the bonding layer 250b has an upper surface 252b, and the upper surface 252b is a convex curved surface. Here, in cross-section, the outline of the bonding layer 250a is a spherical, but the invention is not limited thereto.

Figure 12:
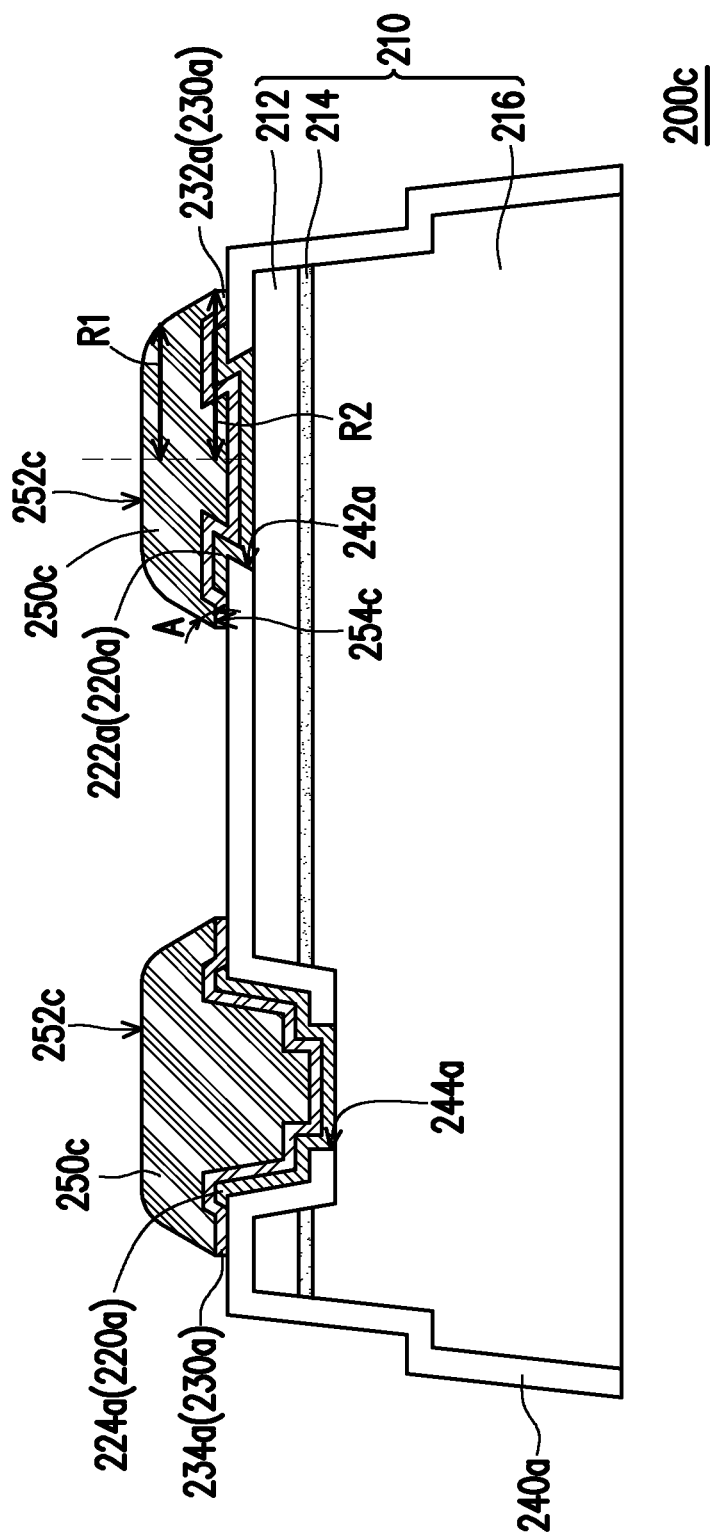
FIG. 12 is a schematic top view of a micro light emitting diode structure according to another embodiment of the invention.

FIG. 12 is a schematic top view of a micro light emitting diode structure according to another embodiment of the invention. Referring to FIG. 10 and FIG. 12 at the same time, a micro light emitting diode structure 200c of the embodiment is similar to the micro light emitting diode structure 200a of FIG. 10, and a difference there between is that in the embodiment, in cross-section, the outline of the bonding layer 250c is a flat cap shape, but the invention is not limited thereto. Furthermore, a ration of a maximum radius R1 of the upper surface 252c to a maximum radius R2 of a bottom surface 254c of the bonding layer 250c in contact with the barrier layer 250c is between 0.5 and 1. An angle A between the upper surface 252c and the bottom surface 254c of the bonding layer 250c is less than or equal to 60 degrees.

Figure 13:
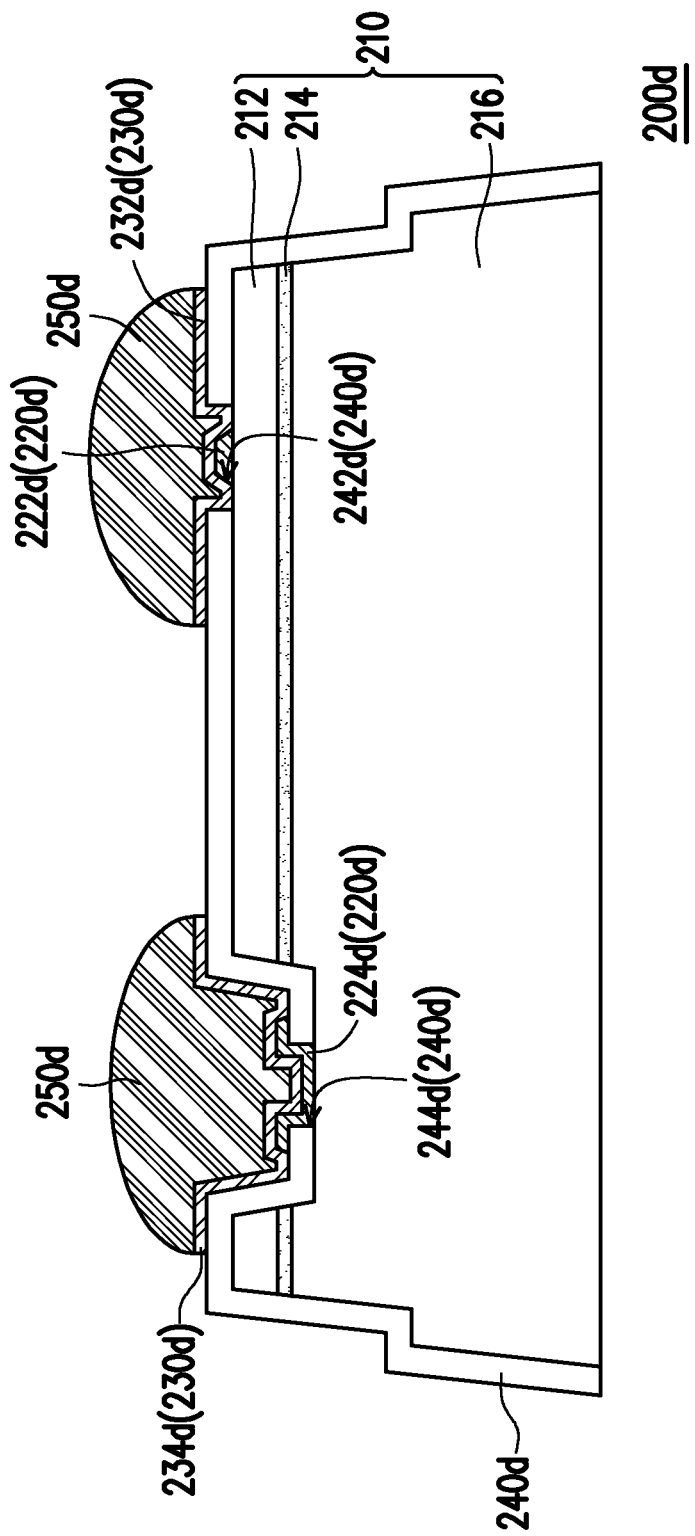
FIG. 13 is a schematic top view of a micro light emitting diode structure according to another embodiment of the invention.

FIG. 13 is a schematic top view of a micro light emitting diode structure according to another embodiment of the invention. Referring to FIG. 10 and FIG. 13 at the same time, a micro light emitting diode structure 200d of the embodiment is similar to the micro light emitting diode structure 200a of FIG. 10, and a difference there between is that in the embodiment, the first electrode 222d of the electrode layer 220d is located in the first opening 242d of the insulating layer 240d, and the first barrier portion 232d of the barrier layer 230d is disposed in the first opening 242d, covers the first electrode 222d and is partially extended on the insulating layer 240d. The second electrode 224d of the electrode layer 220d is located in the second opening 244d of the insulating layer 240d, and the second barrier portion 234d of the barrier layer 230d is disposed in the second opening 244d, covers the second electrode 224d and is partially extended on the insulating layer 240d. Here, the first electrode 222d and the second electrode 224d are only located in the first opening 242d and the second opening 244d, respectively. The bonding layer 250d is disposed on the barrier layer 230d and away from the electrode layer 220d.

Figure 14:
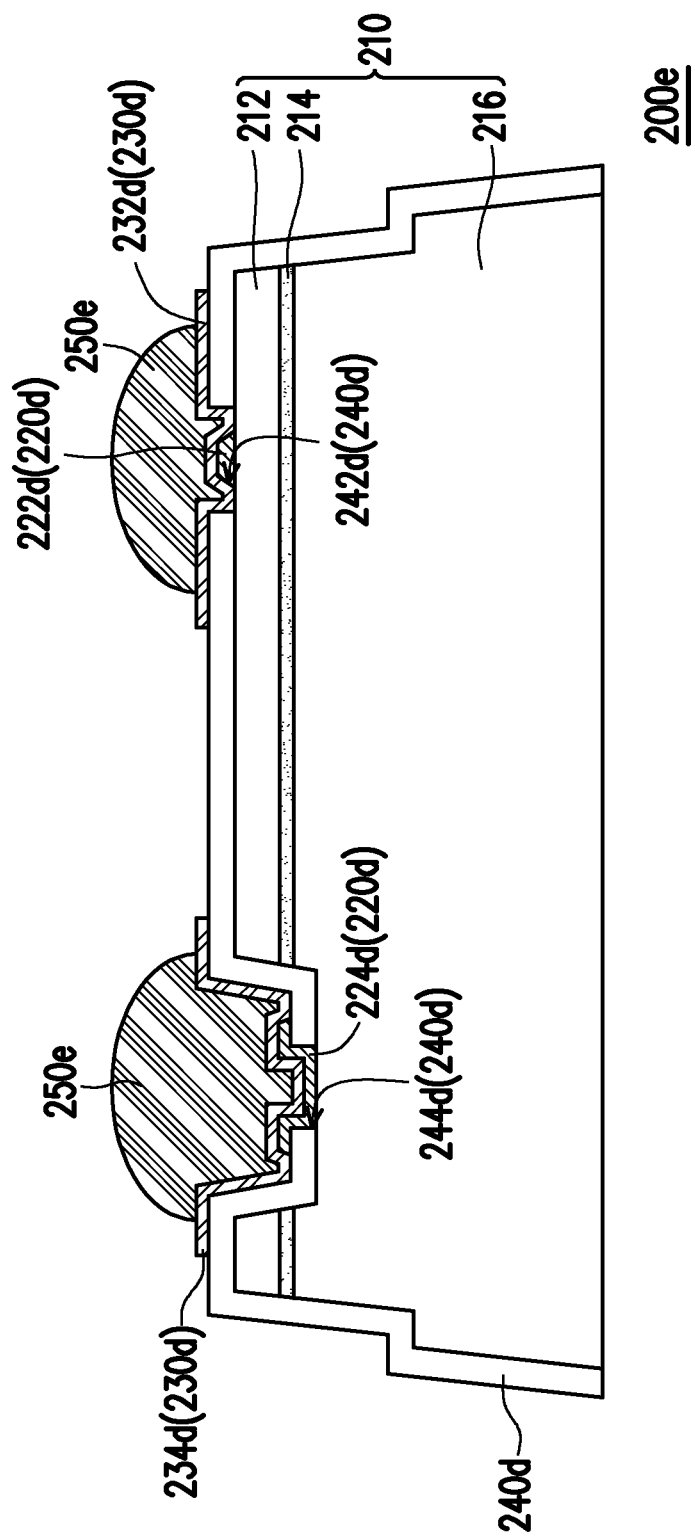
FIG. 14 is a schematic top view of a micro light emitting diode structure according to another embodiment of the invention.

FIG. 14 is a schematic top view of a micro light emitting diode structure according to another embodiment of the invention. Referring to FIG. 13 and FIG. 14 at the same time, a micro light emitting diode structure 200e of the embodiment is similar to the micro light emitting diode structure 200d of FIG. 13, and a difference there between is that in the embodiment, an orthographic projection of the bonding layer 250e on the epitaxial structure 210 is less than and covered by an orthographic projection of the barrier layer 230d on the epitaxial structure 210, and a ration of the orthographic projection of the bonding layer 250e to the orthographic projection of the barrier layer 230d is greater than or equal to 0.5 and less than 1 to prevent overflow.

In brief, in the embodiment, referring to FIG. 10 and FIG. 14 at the same time, an orthographic projection of the bonding layer 250a, 250e on the epitaxial structure 210 is less than or equal to and covers an orthographic projection of the barrier layer 230a, 230d on the epitaxial structure 210, and a ration of the orthographic projection of the bonding layer 250a, 250e to the orthographic projection of the barrier layer 230a, 230d is greater than or equal to 0.5 and less than or equal to 1. If the above ratio is too large, the bonding 250a, 250e will overflow; if the above ration is too small, the bonding force of the bonding layer 250a, 250e will be insufficient.

Figure 15:
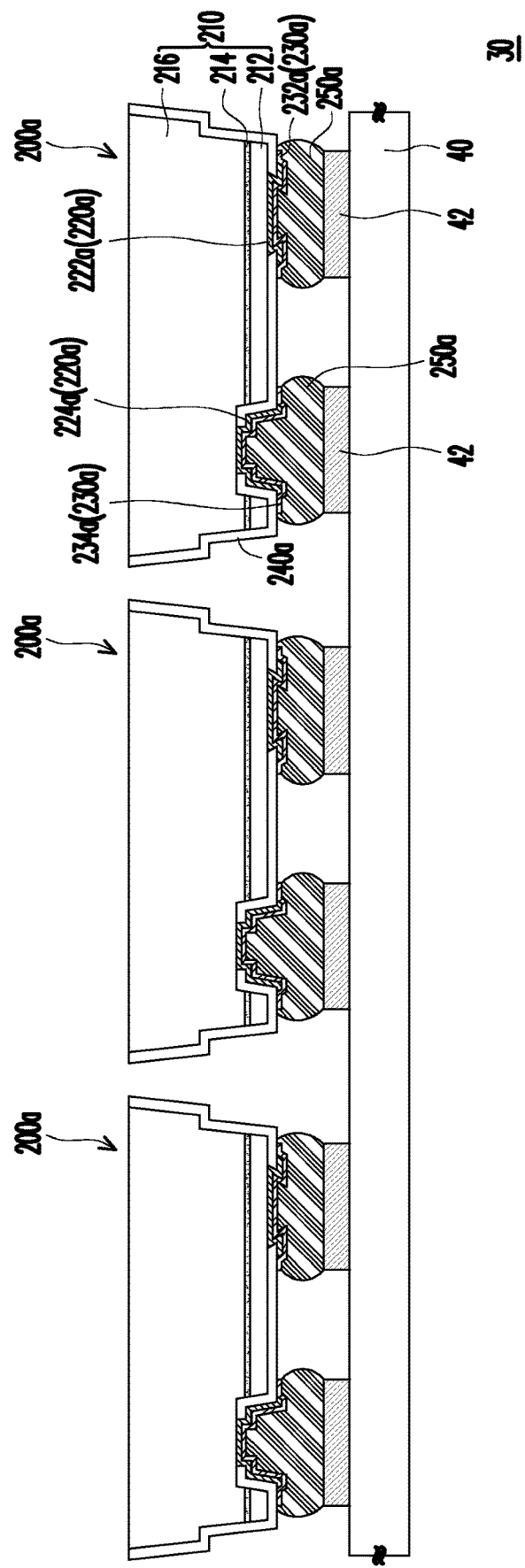
FIG. 15 is a schematic cross-sectional view of a micro light emitting diode display device according to another embodiment of the invention.

FIG. 15 is a schematic cross-sectional view of a micro light emitting diode display device according to another embodiment of the invention. Referring to FIG. 15, in the embodiment, the micro light emitting diode display device 30 includes a display substrate 40 and, for example, a plurality of the micro light emitting diode structure 200a shown in FIG. 10, where the micro light emitting diode structures 200a are disposed on the display substrate 40. In detail, in the embodiment, the display substrate 40 includes a plurality of pads 42, and the bonding layer 250a of each of micro light emitting diode structure 200a is bonded to the pads 22, so that the micro light emitting diode structure 200a is disposed on the display substrate 40 and is electrically connected to the display substrate 40. Here, the bonding layer 250a covers the barrier layer 230a and directly contacts the insulating layer 240a. The barrier layer 230a is disposed on the electrode layer 220a, and the bonding layer 250a is disposed on the barrier layer 230a and away from the electrode layer 220a, which may effectively avoid a problem that the bonding layer 250a overflows to form a eutectic with the first electrode 222a and the second electrode 224a of the electrode layer 220a due to a high temperature and high pressure process of eutectic bonding when the micro light emitting diode structure 200a is bonded to the display substrate 40. In addition to preventing the eutectic problem between the electrode layer 220a and the bonding layer 250a, the barrier layer 230a can also enable the bonding layer 250a disposed thereon to have batter adhesion.

It should be noted that in other embodiments that are not shown, the micro light emitting diode display device may include a plurality of any of the micro light emitting diode structures 200a, 200b, 200c, 200d, 200e according to actual requirements, which is not limited by the invention. Furthermore, in one embodiment, the bonding layer can also be provided on the pads to increase the bonding yield. In addition, the micro light emitting diode structure may be a red micro light emitting diode structure, a blue micro light emitting diode structure or a green micro light emitting diode structure. Moreover, the display substrate 40 of the embodiment may be, for example, a complementary metal-oxide-semiconductor (CMOS) substrate, a liquid crystal on silicon (LCOS) substrate, a thin film transistor (TFT) substrate or other substrates with working circuits, which are not limited by the invention.

In summary, in the design of the micro light emitting diode structure of the invention, the barrier layer is disposed on the electrode layer, and the bonding layer is disposed on the barrier layer and away from the electrode layer. Namely, in the invention, the barrier layer is used to prevent the eutectic problem between the electrode layer and the bonding layer, and can make the bonding layer disposed on the barrier layer have better adhesion. Therefore, the micro light emitting diode structure of the invention may have better electrical properties and structural reliability, and the micro light emitting diode display device using the micro light emitting diode structures of the invention may have better display yield.

It will be apparent to those skilled in the art that various modifications and variations can be made to the disclosed embodiments without departing from the scope or spirit of the invention. In view of the foregoing, it is intended that the invention covers modifications and variations provided they fall within the scope of the following claims and their equivalents.

What is claimed is:

1. A micro light emitting diode structure, comprising:
   an epitaxial structure, comprising a first-type semiconductor layer, a light emitting layer and a second-type semiconductor layer, and having a surface and a through hole, wherein the light emitting layer is located between the first-type semiconductor layer and the second-type semiconductor layer, the first-type semiconductor layer has the surface, the through hole penetrates through the first-type semiconductor layer, the light emitting layer and a part of the second-type semiconductor layer, and the first-type semiconductor layer, the light emitting layer and the second-type semiconductor layer surround the through hole;
   an electrode layer, disposed on the surface of the epitaxial structure and in the through hole of the epitaxial structure, wherein the electrode layer directly contacts the epitaxial structure, and the electrode layer has an upper surface relatively far away from the epitaxial structure and a peripheral surface connected to the upper surface;
   a barrier layer, directly disposed on the electrode layer, wherein the barrier layer completely covers the upper surface and the peripheral surface of the electrode layer; and
   a bonding layer, disposed on the barrier layer and away from the electrode layer.

2. The micro light emitting diode structure as claimed in claim 1, wherein the electrode layer comprises a first electrode and a second electrode, the barrier layer comprises a first barrier portion and a second barrier portion, the first barrier portion covers the first electrode, the second barrier portion covers the second electrode.

3. The micro light emitting diode structure as claimed in claim 2, further comprising:
   an insulating layer, disposed on the epitaxial structure and covering the surface and a peripheral surface of the epitaxial structure, wherein the insulating layer has a first opening exposing the first-type semiconductor layer and a second opening exposing the second-type semiconductor layer, the first electrode is disposed in the first opening and is electrically connected with the first-type semiconductor layer, and the second electrode is disposed in the second opening and is electrically connected with the second-type semiconductor layer.

4. The micro light emitting diode structure as claimed in claim 3, wherein the first barrier portion contacts the insulating layer and the first electrode, and the second barrier portion contacts the insulating layer and the second electrode, ratios of orthographic projections of the first electrode and the second electrode on the epitaxial structure to orthographic projections of the first barrier portion and the second barrier portion on the epitaxial structure are respectively greater than or equal to 0.25 and less than or equal to 0.95.

5. The micro light emitting diode structure as claimed in claim 3, wherein the first electrode is located in the first opening, the first barrier portion is disposed in the first opening, covers the first electrode and is partially extended on the insulating layer, the second electrode is located in the second opening, the second barrier portion is disposed in the second opening, covers the second electrode and is partially extended on the insulating layer.

6. The micro light emitting diode structure as claimed in claim 1, wherein an orthographic projection of the bonding layer on the epitaxial structure is less than or equal to and covers an orthographic projection of the barrier layer on the epitaxial structure, and a ration of the orthographic projection of the bonding layer to the orthographic projection of the barrier layer is greater than or equal to 0.5 and less than or equal to 1.

7. The micro light emitting diode structure as claimed in claim 1, wherein the bonding layer has an upper surface, and the upper surface is a convex curved surface.

8. The micro light emitting diode structure as claimed in claim 7, wherein a curvature of the upper surface gradually decreases from a portion close to the barrier layer to another portion away from the barrier layer.

9. The micro light emitting diode structure as claimed in claim 7, wherein a ration of a maximum radius of the upper surface to a maximum radius of a bottom surface of the bonding layer in contact with the barrier layer is between 0.5 and 1.

10. The micro light emitting diode structure as claimed in claim 9, wherein an angle between the upper surface and the bottom surface of the bonding layer is less than or equal to 60 degrees.

11. The micro light emitting diode structure as claimed in claim 1, wherein the bonding layer has a maximum thickness at a center and an edge thickness at an edge, and the maximum thickness is greater than twice the edge thickness.

12. The micro light emitting diode structure as claimed in claim 1, wherein there is a distance between an edge of the bonding layer and an edge of the electrode layer, and a ration of an orthographic projection of the distance on the epitaxial structure to an orthographic projection of the electrode layer on the epitaxial structure is greater than or equal to 0.2.

13. A micro light emitting diode display device, comprising:
    a display substrate, comprising a plurality of pads; and
    a plurality of micro light emitting diode structures, disposed on the display substrate and respectively comprising:
        an epitaxial structure, comprising a first-type semiconductor layer, a light emitting layer and a second-type semiconductor layer, and having a surface and a through hole, wherein the light emitting layer is located between the first-type semiconductor layer and the second-type semiconductor layer, the first-type semiconductor layer has the surface, the through hole penetrates through the first-type semiconductor layer, the light emitting layer and a part of the second-type semiconductor layer, and the first-type semiconductor layer, the light emitting layer and the second-type semiconductor layer surround the through hole;
        an electrode layer, disposed on the surface of the epitaxial structure and in the through hole of the epitaxial structure, wherein the electrode layer directly contacts the epitaxial structure, and the electrode layer has an upper surface relatively far away from the epitaxial structure and a peripheral surface connected to the upper surface;
        a barrier layer, directly disposed on the electrode layer, wherein the barrier layer completely covers the upper surface and the peripheral surface of the electrode layer; and
        a bonding layer, disposed on the barrier layer, wherein the bonding layer is bonded to the corresponding pads, so that the micro light-emitting diode structures are electrically connected to the display substrate.

14. The micro light emitting diode display device as claimed in claim 13, wherein each of the plurality of micro light emitting diode structures further comprises:
    an insulating layer, disposed on the epitaxial structure and covering the surface and a peripheral surface of the epitaxial structure, wherein the insulating layer has a first opening exposing the first-type semiconductor layer and a second opening exposing the second-type semiconductor layer, the electrode layer comprises a first electrode and a second electrode, the first electrode is disposed in the first opening and is electrically connected with the first-type semiconductor layer, and the second electrode is disposed in the second opening and is electrically connected with the second-type semiconductor layer, and the bonding layer directly contacts the insulating layer.

* * * * *